(12) United States Patent
Aoki et al.

(10) Patent No.: US 11,159,161 B2
(45) Date of Patent: Oct. 26, 2021

(54) BUTTON STRUCTURE FOR TOUCH PANEL, BUTTON FOR TOUCH PANEL, AND ELECTRONIC DEVICE (71) Applicant: Mitsubishi Electric Corporation, Tokyo (JP)

(72) Inventors: Ryota Aoki, Tokyo (JP); Hiroki Akatsuka, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 55 days.

(21) Appl. No.: 16/492,389

(22) PCT Filed: Apr. 19, 2017

(86) PCT No.: PCT/JP2017/015710
§ 371 (c)(1),
(2) Date: Sep. 9, 2019

(87) PCT Pub. No.: WO2018/193549
PCT Pub. Date: Oct. 25, 2018

(65) Prior Publication Data
US 2021/0135672 A1 May 6, 2021

(51) Int. Cl.
*H03K 17/96* (2006.01)
*G06F 3/02* (2006.01)
*G06F 3/044* (2006.01)

(52) U.S. Cl.
CPC ......... *H03K 17/962* (2013.01); *G06F 3/0202* (2013.01); *G06F 3/044* (2013.01); *H03K 2217/960755* (2013.01)

(58) Field of Classification Search
CPC ...... H03K 17/962; G06F 3/0202; G06F 3/044
(Continued)

(56) References Cited

U.S. PATENT DOCUMENTS 5,278,362 A * 1/1994 Ohashi .................. H01H 9/181
200/314
5,977,888 A * 11/1999 Fujita .................. H01H 13/705
341/34
(Continued)

FOREIGN PATENT DOCUMENTS

CN 101075507 A 11/2007
CN 103871766 A 6/2014
(Continued)

OTHER PUBLICATIONS

International Search Report, issued in PCT/JP2017/015710, PCT/ISA/210, dated Jun. 20, 2017.
(Continued)

*Primary Examiner* — Prabodh M Dharia
(74) *Attorney, Agent, or Firm* — Birch, Stewart, Kolasch & Birch, LLP.

(57) ABSTRACT

A button for a touch panel that includes a first operating unit made of a conductor and to be operated by being pushed down; a supporting portion made of an insulator and to be fixed on a capacitive touch panel, the supporting portion supporting the first operating unit; and an elastic member accommodated inside the supporting portion, a surface of the elastic member being nonconductive, the surface being fixed to the touch panel, the elastic member is elastically, deformed when the first operating unit is pushed down, in which the pushing operation of the first operating unit is detected by the touch panel.

8 Claims, 7 Drawing Sheets

(58) Field of Classification Search
USPC .......... 345/174; 358/1.14; 200/314; 341/34
See application file for complete search history.

(56) References Cited

U.S. PATENT DOCUMENTS

| | | | |
|---|---|---|---|
| 2014/0158512 A1 | 6/2014 | Kato | |
| 2015/0085312 A1* | 3/2015 | Tanimoto | H04N 1/32122 358/1.14 |
| 2018/0164940 A1* | 6/2018 | Li | G06F 3/04142 |
| 2019/0391672 A1* | 12/2019 | Fischer | G06F 3/044 |

FOREIGN PATENT DOCUMENTS

| | | |
|---|---|---|
| JP | 60-42231 U | 3/1985 |
| JP | 9-251347 A | 9/1997 |
| JP | 2005-310629 A | 11/2005 |
| JP | 2007-305540 A | 11/2007 |
| JP | 2012-181732 A | 9/2012 |
| JP | 2013-186734 A | 9/2013 |
| JP | 2014-116274 A | 6/2014 |
| JP | 2016-149352 A | 8/2016 |
| WO | WO 2016/125216 A1 | 8/2016 |

OTHER PUBLICATIONS

Japanese Office Action dated Sep. 29, 2020 issued in corresponding Japanese Patent Application No. 2019-513139 with machine translation.
Japanese Office Action for Japanese Application No. 2019-513139, dated Jan. 28, 2020, with English translation.
Chinese Office Action and Search Report, dated Dec. 18, 2020, for Chinese Application No. 201780089568.7, with English translations.
Chinese Office Action dated Aug. 4, 2021 issued in corresponding Chinese Patent Application No. 201780089568.7 with an English Translation.

* cited by examiner

BUTTON STRUCTURE FOR TOUCH PANEL, BUTTON FOR TOUCH PANEL, AND ELECTRONIC DEVICE

TECHNICAL FIELD

The present invention relates to a button structure for touch panel, a button for touch panel, and an electronic device.

BACKGROUND ART

Some of electronic devices such as navigation devices include both a display with a capacitive touch panel and a mechanical switch mechanism.

Patent Literature 1 discloses a car navigation device including an LCD display device, a touch panel, a switch knob, a switch knob pushing rod, a tact switch, a tact switch substrate, and the like.

Since the surface of the touch panel is smooth, a user needs to visually recognize the touch panel when operating it. On the other hand, the switch knob protrudes with respect to the surface of the touch panel. Therefore, the user can perform intuitive operation without visually recognizing the switch knob. In addition, a switch mechanism includes the tact switch. Therefore, the user can obtain operational feeling upon operation.

CITATION LIST

Patent Literature

Patent Literature 1:
JP 2005-310629 A ([0017] and FIG. 1)

SUMMARY OF INVENTION

Technical Problem

The car navigation device disclosed in Patent Literature 1 includes the mechanical switch mechanism, and the switch mechanism needs to be arranged outside an operation detection area of the touch panel. In other words, the arrangement of the mechanical switch mechanism is subjected to restriction by the touch panel. This is because it is necessary to provide the tact switch and the substrate for supporting the tact switch, which are components of the mechanical switch mechanism.

The present invention has been made to solve the problems as described above, and an object of the present invention is to obtain a button structure for touch panel, a button for touch panel, and an electronic device which are not subjected to restriction of arrangement by a touch panel.

Solution to Problem

A button structure for touch panel according to the present invention includes: a first operating unit made of a conductor and to be operated by being pushed down; a supporting portion made of an insulator and to be fixed on a capacitive touch panel, the supporting portion supporting the first operating unit; and an elastic member accommodated inside the supporting portion, a surface of the elastic member being nonconductive, the surface being to be fixed to the touch panel, in which when the first operating unit is pushed down, the elastic member is elastically deformed and the pushing operation of the first operating unit is detected by the touch panel.

Advantageous Effects of Invention

According to the present invention, it is possible to obtain a button structure for touch panel, a button for touch panel, and an electronic device which are not subjected to restriction of arrangement by a touch panel.

DESCRIPTION OF EMBODIMENTS

First Embodiment

To describe the invention further in detail, embodiments for carrying out the invention will be described below with reference to the accompanying drawings.

Figure 1:
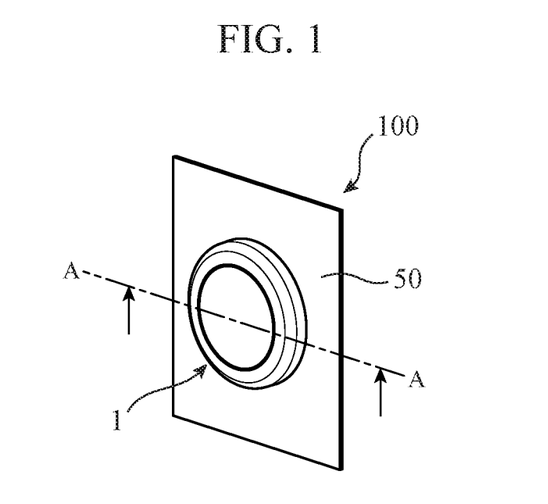
FIG. 1 is an external perspective view of an electronic device to which a button structure for touch panel according to a first embodiment is applied.

FIG. 1 is an external perspective view of an electronic device 100 to which a button structure for touch panel according to a first embodiment is applied.

The electronic device 100 includes a button 1 for touch panel, a touch panel 50, a liquid crystal display (not illustrated), and the like. The touch panel 50 is a capacitive touch panel.

Figure 2:
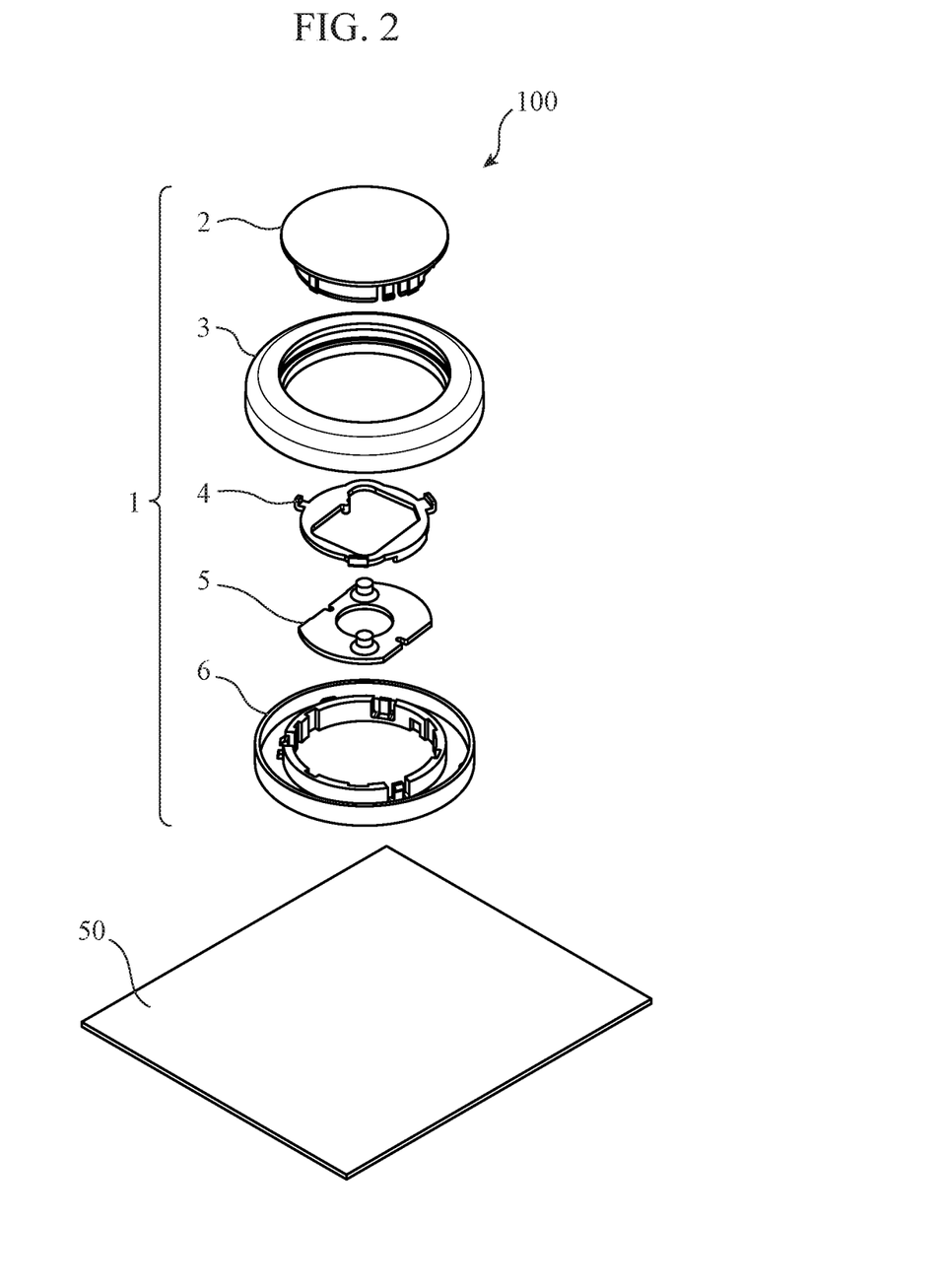
FIG. 2 is an exploded perspective view of the electronic device to which the button structure for touch panel according to the first embodiment is applied.

FIG. 2 is an exploded perspective view of the electronic device 100 to which the button structure for touch panel according to the first embodiment is applied.

A button for touch panel to which the button structure for touch panel according to the first embodiment is applied is regarded as the button 1 for touch panel. The button 1 for touch panel includes a first operating unit 2, a second operating unit 3, a holder 4, an elastic member 5, and a supporting portion 6.

Figure 3:
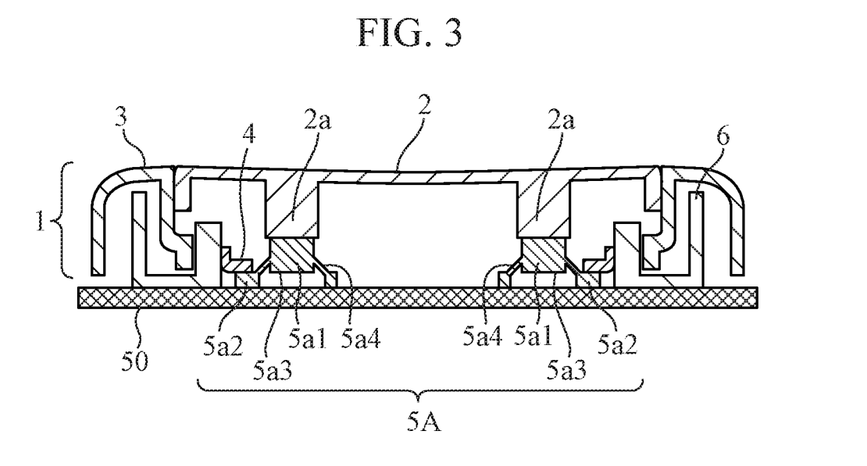
FIG. 3 is a cross-sectional view of the electronic device taken along line AA of FIG. 1.

FIG. 3 is a cross-sectional view of the electronic device 100 taken along line AA of FIG. 1.

The first operating unit 2 is a circular component. The first operating unit 2 is to be operated by being pushed down. The first operating unit 2 has first pushers 2a. The first pusher 2a is a protruding portion erected on the surface opposite to the operation surface of the first operating unit 2. The first pusher 2a is provided at least at one place. FIG. 3 illustrates an example in which the first pushers 2a are provided at two places. The first pushers 2a press the elastic member 5, which will be described later, when the first operating unit 2 is pushed down. The first operating unit 2 is a conductor subjected to conductive surface treatment. The surface treatment includes plating treatment, conductive coating, formation of a transparent conductive film, and the like.

The second operating unit 3 is an annular component having a hollow portion. The second operating unit 3 is to be operated by being rotated. The second operating unit 3 is a conductor subjected to conductive surface treatment similar to that of the first operating unit 2. The second operating unit 3 is provided with a plurality of conductive contact portions 3a (not illustrated) that come in contact with the touch panel 50 when attached to the touch panel 50. The plurality of conductive contact portions 3a is made of, for example, conductive rubber. As the second operating unit 3 rotates, contact positions of the plurality of conductive contact portions 3a on the touch panel 50 change. This allows the touch panel 50 to detect the position of the second operating unit 3 that is rotated.

As illustrated in FIG. 2, the supporting portion 6 is an annular component having a hollow portion. The supporting portion 6 is made of resin. The supporting portion 6 is an insulator. The supporting portion 6 is fixed to the touch panel 50 by an adhesive agent, a double-sided tape, or the like.

The supporting portion 6 supports the first operating unit 2. The first operating unit 2 is supported by the supporting portion 6 so that the first operating unit 2 is movable in the push-down direction. The supporting portion 6 supports the second operating unit 3. The second operating unit 3 is supported by the supporting portion 6 so that the second operating unit 3 is movable in a rotational direction. The elastic member 5 is accommodated in the hollow portion of the supporting portion 6, that is, inside the supporting portion 6.

As illustrated in FIG. 2, the holder 4 is an annular component having a hollow portion. The holder 4 is made of resin. The holder 4 is an insulator. The holder 4 holds the edge of the elastic member 5. The holder 4 has hooks. The holder 4 is attached to the supporting portion 6 by engaging the hooks with engaging holes formed in the supporting portion 6.

The elastic member 5 is a component that is to be elastically deformed. The elastic member 5 is a rubber switch 5A or a plate spring 5B. The elastic member 5 biases the first operating unit 2 in the opposite direction to a direction toward the touch panel 50. The elastic member 5 is elastically deformed when pressed by the first pushers 2a provided to the first operating unit 2. The elastic member 5 generates click feeling when elastically deformed.

FIG. 3 is a diagram illustrating a case where the rubber switch 5A is used as the elastic member 5.

The rubber switch 5A includes protrusions 5a1, a base portion 5a2, contact points 5a3, and skirt portions 5a4. The rubber switch 5A is made of conductive rubber. However, in the base portion 5a2, a surface fixed to the touch panel 50 is nonconductive.

The protrusion 5a1 is a key top. The protrusion 5a1 is provided at least at one place. FIG. 3 is a diagram illustrating an example in which the protrusions 5a1 are provided at two places in the circular base portion 5a2. The protrusion 5a1 is a column portion that protrudes into the opposite side to the touch panel 50 side. The protrusion 5a1 is in contact with the first pusher 2a formed in the first operating unit 2. An end surface of the protrusion 5a1 on the opposite side to an end surface in contact with the first pusher 2a is the contact point 5a3.

While the first operating unit 2 is not pushed down, that is, while the protrusions 5a1 are not pressed by the first pushers 2a, the contact points 5a3 of the protrusions 5a1 and the touch panel 50 are separated.

When the first operating unit 2 is pushed down, the first pushers 2a press the protrusions 5a1. At this time, the skirt portions 5a4 of the rubber switch 5A are elastically deformed (buckled) to generate click feeling, and the contact points 5a3 of the protrusions 5a1 are brought into contact with the touch panel 50.

Figure 4:
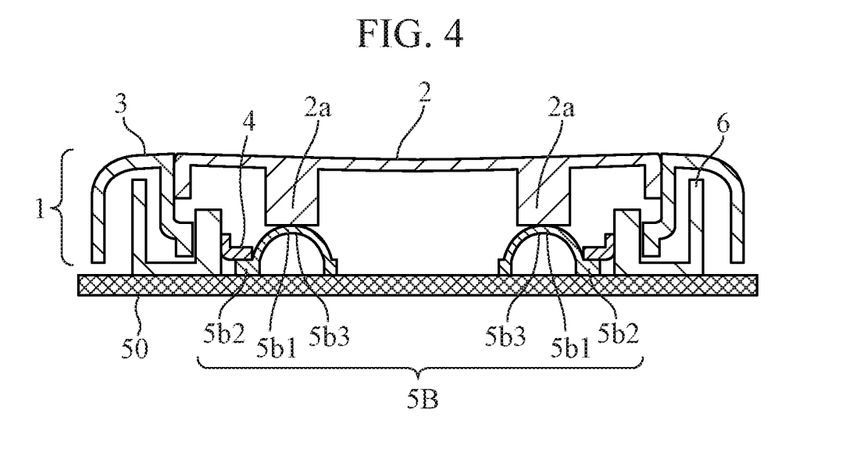
FIG. 4 is another cross-sectional view of the electronic device taken along line AA of FIG. 1.

FIG. 4 is a diagram illustrating a case where the plate spring 5B is used as the elastic member 5 in the configuration of FIG. 3.

The plate spring 5B includes protrusions 5b1, a base portion 5b2, and contact points 5b3. The plate spring 5B is conductive. However, in the base portion 5b2, a surface fixed to the touch panel 50 is nonconductive.

FIG. 4 is a diagram illustrating an example in which two protrusions 5b1 are used. The protrusion 5b1 is a curved portion that protrudes into the opposite side to the touch panel 50 side. The protrusion 5b1 is in contact with the first pusher 2a formed in the first operating unit 2. A surface of the protrusion 5b1 on the opposite side to a surface in contact with the first pusher 2a is the contact point 5b3.

While the first operating unit 2 is not pushed down, that is, while the protrusions 5b1 are not pressed by the first pushers 2a, the contact points 5b3 of the protrusions 5b1 and the touch panel 50 are separated.

When the first operating unit 2 is pushed down, the first pushers 2a press the protrusions 5b1. At this time, the protrusions 5b1 of the plate spring 5B are elastically deformed to generate click feeling, and the contact points 5b3 of the protrusions 5b1 are brought into contact with the touch panel 50.

Figure 5:
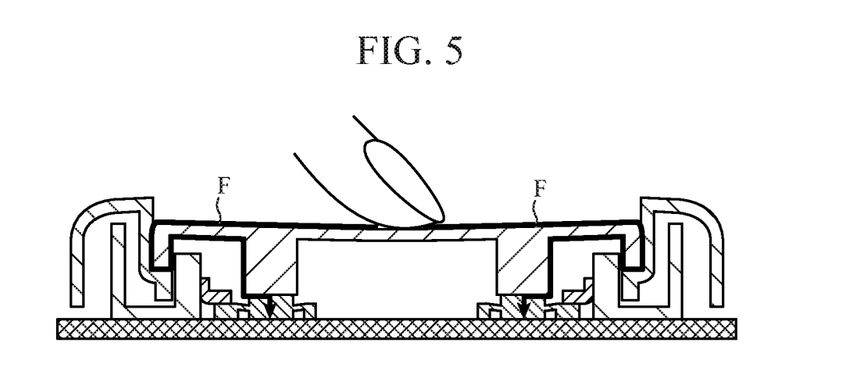
FIG. 5 is a diagram illustrating an exemplary conductive path.

FIG. 5 is a diagram illustrating an exemplary conductive path when the first operating unit 2 is pushed down. FIG. 5 is a diagram illustrating a case where the rubber switch 5A is used as the elastic member 5.

In FIG. 5, a user's finger touches the first operating unit 2 to push down the first operating unit 2, and the contact points 5a3 of the protrusions 5a1 are brought into contact with the touch panel 50.

At this time, a conductive path F passing through the first operating unit 2, the second operating unit 3, and the rubber switch 5A is formed as illustrated in FIG. 5.

When the contact points 5a3 of the protrusions 5a1 are brought into contact with the touch panel 50, a change in capacitance occurs in the touch panel 50. The touch panel 50 detects that the first operating unit 2 is pushed down on the basis of the change in the capacitance.

As described above, the button structure for touch panel according to the first embodiment includes: the first operating unit 2 made of a conductor and to be operated by being pushed down; the supporting portion 6 made of an insulator and to be fixed on the capacitive touch panel 50, the supporting portion 6 supporting the first operating unit 2; and the elastic member 5 accommodated inside the supporting portion 6, a surface of the elastic member 5 being nonconductive, the surface being to be fixed to the touch panel 50, in which when the first operating unit 2 is pushed down, the elastic member 5 is elastically deformed and the pushing operation of the first operating unit 2 is detected by the touch panel. As a result, it is possible to obtain the button structure for touch panel which is not subjected to restriction of arrangement by the touch panel.

In addition, the button structure for touch panel according to the first embodiment does not require a tact switch and a substrate for supporting the tact switch, which are required in the configuration of the related art. Thus, the cost can be reduced.

In addition, since the button structure for touch panel according to the first embodiment protrudes with respect to the surface of the touch panel, a user can perform intuitive operation.

Moreover, the button structure for touch panel according to the first embodiment includes the elastic member 5 that is elastically deformed when the first operating unit 2 is pushed down. Therefore, the user can obtain operational feeling upon operation.

Figure 6:
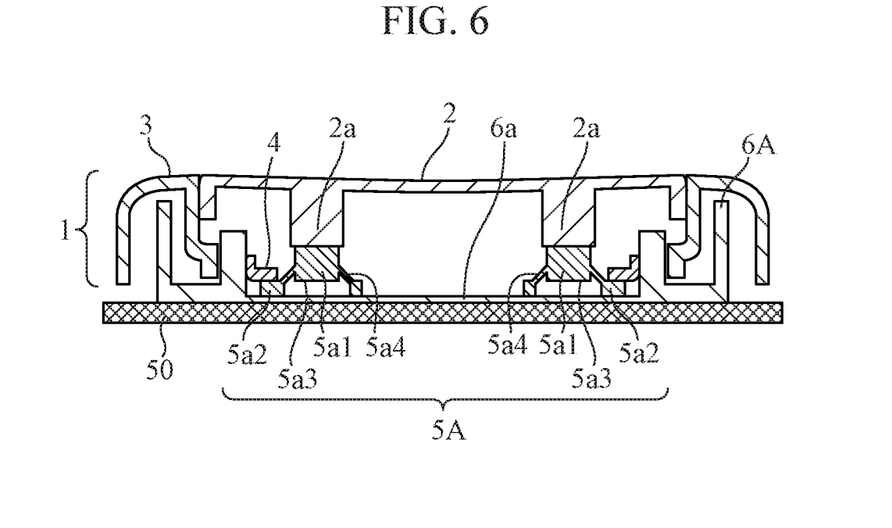
FIG. 6 is another cross-sectional view of the electronic device taken along line AA of FIG. 1.

FIG. 6 is another cross-sectional view of the electronic device 100 taken along line AA of FIG. 1. FIG. 6 is a diagram illustrating a case where the rubber switch 5A is used as the elastic member 5.

Although the supporting portion 6 having the hollow portion is illustrated in FIGS. 3, 4, and 5, a supporting portion 6A illustrated in FIG. 6 does not have a hollow portion. As illustrated in FIG. 6, the supporting portion 6A has a thin portion 6a. The thin portion 6a is formed on the inner circumferential side of the annular supporting portion 6A. The thin portion 6a supports the rubber switch 5A or the plate spring 5B from a side of the touch panel 50. The supporting portion 6A is an insulator. The thin portion 6a is formed to be thin. The thickness of the thin portion 6a is a thickness that allows a change in capacitance to occur in the touch panel 50 when the contact points 5a3 or the contact points 5b3 are brought into contact with the thin portion 6a. The thickness of the thin portion 6a is, for example, 0.3 mm. Forming the thin portion 6a allows the button 1 for touch panel to be carried solely. Note that, in the base portions 5a2 and 5b2, surfaces fixed to the thin portion 6a are nonconductive.

When the first operating unit 2 is pushed down, the contact points 5a3 or the contact points 5b3 are brought into contact with the thin portion 6a. At this time, a change in capacitance occurs in the touch panel 50. The touch panel 50 detects that the first operating unit 2 is pushed down on the basis of the change in the capacitance.

Figure 7A:
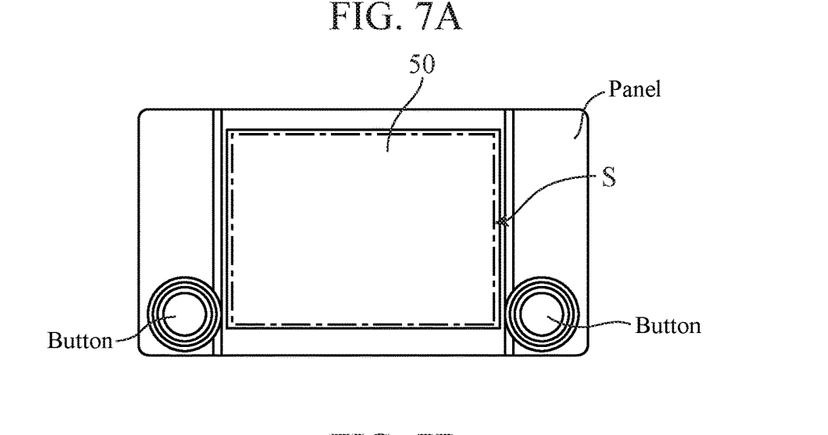
FIG. 7A is a diagram for explaining a conventional electronic device.

FIG. 7A is a diagram for explaining a conventional electronic device. When a tact switch is used as in the related art, it is necessary to provide a button outside an operation detection area S of the touch panel 50.

Figure 7B:
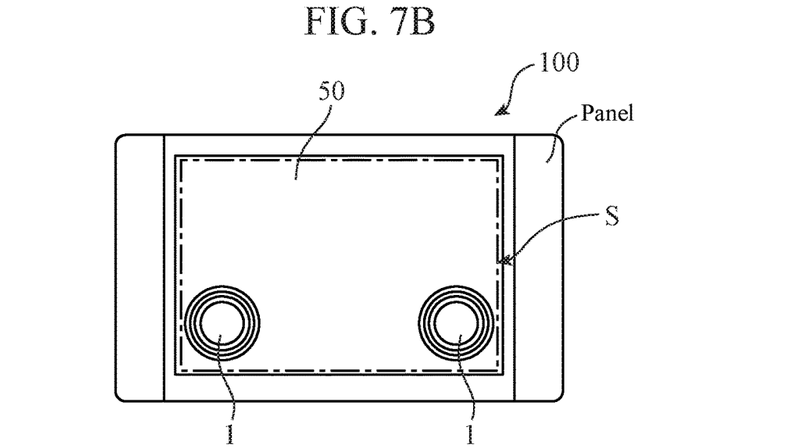
FIGS. 7B and 7C are diagrams for explaining the electronic device according to the first embodiment.
Figure 7C:
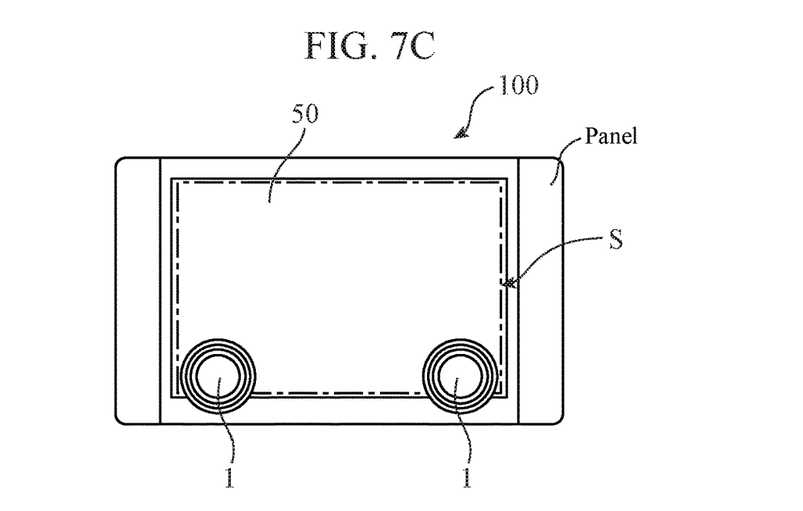

FIGS. 7B and 7C are diagrams for explaining the electronic device 100. As illustrated in FIG. 7B, the button 1 for touch panel can be freely provided inside the operation detection area S of the touch panel 50. Moreover, as illustrated in FIG. 7C, it is also possible to provide the button 1 for touch panel at a boundary part between the operation detection area S and a panel.

Second Embodiment

Figure 8:
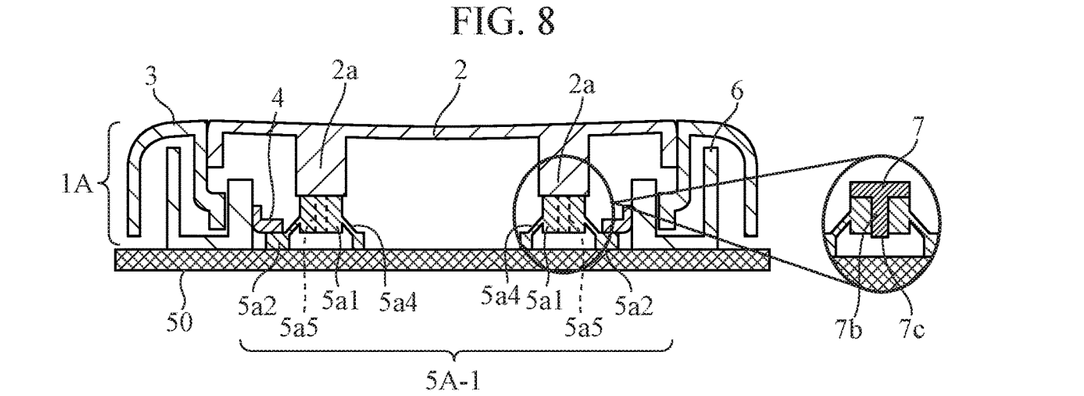
FIG. 8 is a cross-sectional view of an electronic device to which a button structure for touch panel according to a second embodiment is applied.

FIG. 8 is a cross-sectional view of an electronic device to which a button structure for touch panel according to a second embodiment is applied.

Hereinafter, the same reference numerals are given to components having the same functions as or equivalent functions to those described in the first embodiment, and description thereof will be omitted or simplified.

A button for touch panel to which the button structure for touch panel according to the second embodiment is applied is regarded as a button 1A for touch panel.

In the first embodiment, the case where the rubber switch 5A is conductive has been described. In the case where the rubber switch is conductive, there are problems in which the keying durability decreases and the rubber becomes hard to deteriorate the operational feeling. The button structure for touch panel according to the second embodiment is made to solve such problems. In the second embodiment, a nonconductive rubber switch 5A-1 is used as the elastic member 5.

The rubber switch 5A-1 includes protrusions 5a1, a base portion 5a2, skirt portions 5a4, and through-holes 5a5. The through-hole 5a5 is formed along the axial direction in the center of the cylindrical protrusion 5a1. Conductive parts 7, which will be described later, are inserted in the through-holes 5a5.

Figure 9:
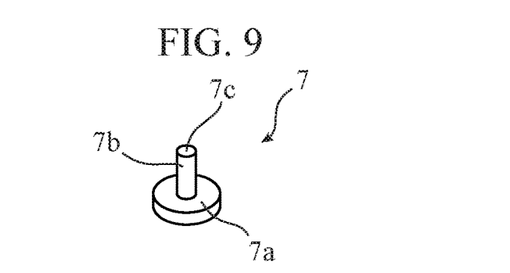
FIG. 9 is a diagram for explaining a conductive part.

FIG. 9 is a diagram for explaining the conductive part 7.

The conductive part 7 is a conductive component. The conductive part 7 is subjected to, for example, conductive surface treatment similar to the conductive surface treatment applied to the first operating unit 2. The conductive part 7 includes a disk portion 7a, a column portion 7b, and a contact point 7c.

The disk portion 7a is a disc-shaped portion. The column portion 7b is a columnar portion erected at the center of the disk portion 7a. The column portion 7b has a diameter that allows insertion into the through-hole 5a5 of the rubber switch 5A-1. The end surface of the column portion 7b forms the contact point 7c.

As illustrated in FIG. 8, the conductive part 7 is attached to the rubber switch 5A-1 in such a manner that the column portion 7b is inserted into the through-hole 5a5 of the rubber switch 5A-1. The disk portion 7a is in contact with the first pusher 2a formed in the first operating unit 2.

While the first operating unit 2 is not pushed down, that is, while the protrusions 5a1 are not pressed by the first pushers 2a via the conductive parts 7, the contact points 7c of the conductive parts 7 and the touch panel 50 are separated.

When the first operating unit 2 is pushed down, the first pushers 2a press the protrusions 5a1 via the conductive parts 7. At this time, the skirt portions 5a4 of the rubber switch 5A-1 are elastically deformed (buckled) to generate click feeling, and the contact points 7c of the conductive parts 7 are brought into contact with the touch panel 50.

When the contact points 7c of the conductive parts 7 are brought into contact with the touch panel 50, a change in capacitance occurs in the touch panel 50. The touch panel 50 detects that the first operating unit 2 is pushed down on the basis of the change in the capacitance.

As described above, according to the second embodiment, decrease of the keying durability of the rubber switch 5A-1 can be prevented and deterioration of the operational feeling when the first operating unit 2 is pushed down can be prevented by using the nonconductive rubber switch 5A-1 and the conductive part 7 in addition to the effects of the first embodiment.

Third Embodiment

Figure 10:
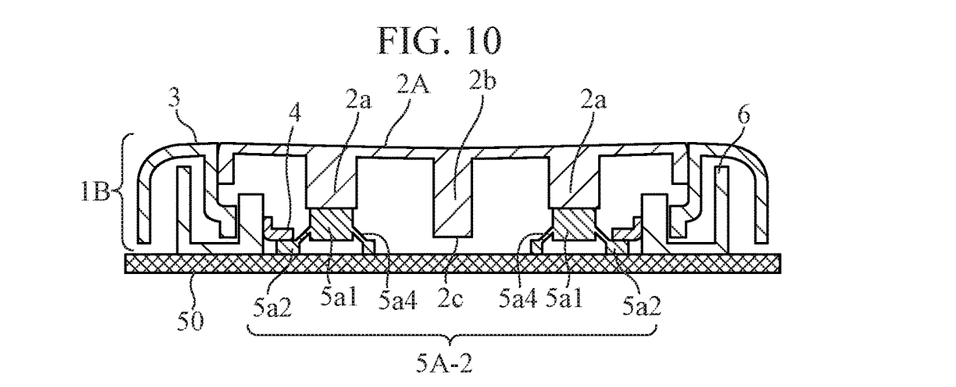
FIG. 10 is a cross-sectional view of an electronic device to which a button structure for touch panel according to a third embodiment is applied.

FIG. 10 is a cross-sectional view of an electronic device to which a button structure for touch panel according to a third embodiment is applied.

Hereinafter, the same reference numerals are given to components having the same functions as or equivalent functions to those described in the first and second embodiments, and description thereof will be omitted or simplified.

A button for touch panel to which the button structure for touch panel according to the third embodiment is applied is regarded as a button 1B for touch panel.

In the second embodiment, the case has been described where the nonconductive rubber switch 5A-1 is used as the elastic member 5 and the conductive parts 7 are also used. In the third embodiment, a case where the conductive parts 7 are not used will be described.

In the third embodiment, a nonconductive rubber switch 5A-2 is used as the elastic member 5. The rubber switch 5A-2 includes protrusions 5a1, a base portion 5a2, and skirt portions 5a4.

The protrusion 5a1 is in contact with the first pusher 2a formed in the first operating unit 2. The rubber switch 5A-2 is provided only to implement the operational feeling when the first operating unit 2 is pushed down.

In the third embodiment, a first operating unit 2A is used. The first operating unit 2A is a conductor. The first operating unit 2A is subjected to conductive surface treatment similar to the conductive surface treatment applied to the first operating unit 2 according to the first embodiment. The first operating unit 2A includes first pushers 2a, a second pusher 2b, and a contact point 2c. The second pusher 2b is a protruding portion erected on the surface opposite to the operation surface of the first operating unit 2A.

FIG. 10 is a diagram illustrating an example in which the second pusher 2b is provided at the center of the surface opposite to the operation surface of the first operating unit 2A. The end surface of the second pusher 2b forms the contact point 2c.

While the first operating unit 2A is not pushed down, that is, while the protrusions 5a1 are not pressed by the first pushers 2a, the contact point 2c of the second pusher 2b and the touch panel 50 are separated.

When the first operating unit 2A is pushed down, the first pushers 2a press the protrusions 5a1. At this time, the skirt portions 5a4 of the rubber switch 5A-2 are elastically deformed (buckled) to generate click feeling, and the contact point 2c of the second pusher 2b is brought into contact with the touch panel 50.

Figure 11:
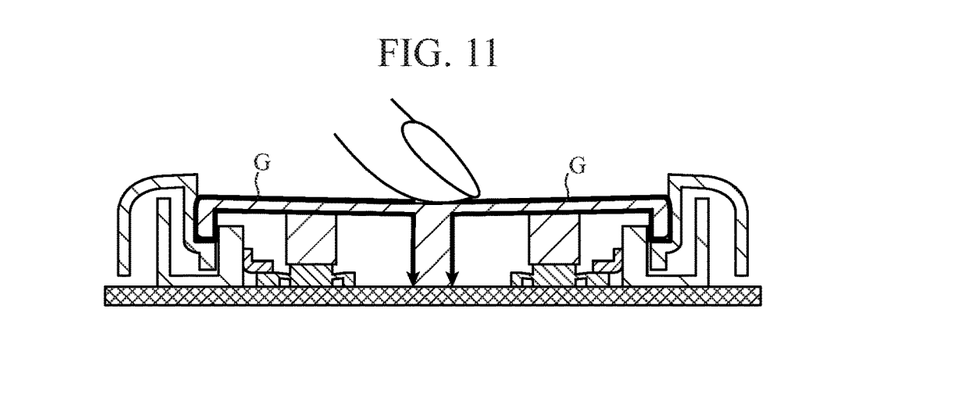
FIG. 11 is a diagram illustrating an exemplary conductive path.

FIG. 11 is a diagram illustrating an exemplary conductive path when the first operating unit 2A is pushed down.

In FIG. 11, a user's finger touches the first operating unit 2A to push down the first operating unit 2A, and the contact point 2c of the second pusher 2b is in contact with the touch panel 50. At this time, a conductive path G is formed as illustrated in FIG. 11.

When the contact point 2c of the second pusher 2b is brought into contact with the touch panel 50, a change in capacitance occurs in the touch panel 50. The touch panel 50 detects that the first operating unit 2A is pushed down on the basis of the change in the capacitance.

Note that, in the first operating unit 2A, it is possible to omit to perform conductive surface treatment on the first pushers 2a, the treatment making them conductive.

As described above, according to the third embodiment, decrease of the keying durability of the rubber switch 5A-2 can be prevented and deterioration of the operational feeling when the first operating unit 2A is pushed down can be prevented by using the nonconductive rubber switch 5A-2 and the first operating unit 2A having the second pusher 2b in addition to the effects of the first embodiment.

Fourth Embodiment

Figure 12:
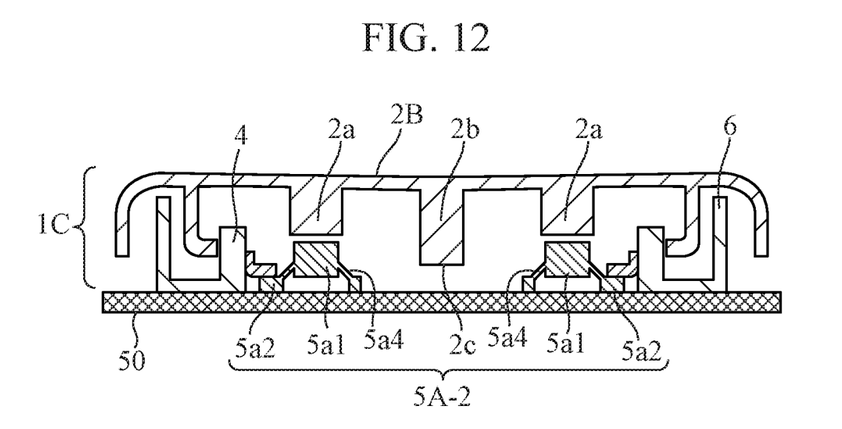
FIG. 12 is a cross-sectional view of an electronic device to which a button structure for touch panel according to a fourth embodiment is applied.

FIG. 12 is a cross-sectional view of an electronic device to which a button structure for touch panel according to a fourth embodiment is applied.

Hereinafter, the same reference numerals are given to components having the same functions as or equivalent functions to those described in the first, second, and third embodiments, and description thereof will be omitted or simplified.

A button for touch panel to which the button structure for touch panel according to the fourth embodiment is applied is regarded as a button 1C for touch panel.

In the first embodiment, the case has been described where the first operating unit 2 and the second operating unit 3 are separate components. In the fourth embodiment, a first operating unit 2B solely takes on the function of the second operating unit 3.

Moreover, the rubber switch 5A-2 is used as the elastic member 5 in the fourth embodiment like in the third embodiment.

In the fourth embodiment, the first operating unit 2B is used. The first operating unit 2B is a conductor. The first operating unit 2B is subjected to conductive surface treatment similar to the conductive surface treatment applied to the first operating unit 2 according to the first embodiment.

The first operating unit 2B includes first pushers 2a, a second pusher 2b, a contact point 2c, and a plurality of conductive contact portions 2d (not illustrated). In FIG. 12, illustrated is an example in which the second pusher 2b is provided at the center of the surface opposite to the operation surface of the first operating unit 2B.

The plurality of conductive contact portions 2d is always in contact with the touch panel 50. The plurality of conductive contact portions 2d is made of, for example, conductive rubber. The positions where the plurality of conductive contact portions 2d is in contact with the touch panel 50 change with the rotation of the first operating unit 2B. As a result, the touch panel 50 can detect the position of the first operating unit 2B having been rotated. The plurality of conductive contact portions 2d biases the first operating unit 2B in the opposite direction to a direction toward the touch panel 50. The plurality of conductive contact portions 2d is elastically deformed when the first operating unit 2B is pushed down.

The contact point 2c of the second pusher 2b is separated from the touch panel 50 while the first operating unit 2B is not pushed down.

Furthermore, in the height direction of the button 1C for touch panel, there is a gap between end surfaces of the protrusions 5a1 and the first pushers 2a. This allows the first operating unit 2B to be rotated.

When the first operating unit 2B is pushed down, the first pushers 2a and the protrusions 5a1 are brought into contact with each other. When the first operating unit 2B is further pushed down, the skirt portions 5a4 are elastically deformed (buckled) to generate click feeling, and the contact point 2c of the second pusher 2b is brought into contact with the touch panel 50.

When the contact point 2c of the second pusher 2b is brought into contact with the touch panel 50, a change in capacitance occurs in the touch panel 50. The touch panel 50 detects that the first operating unit 2B is pushed down on the basis of the change in the capacitance.

As described above, in addition to the effects of the first to third embodiments, integrating the first operating unit 2 and the second operating unit 3 enables user's more intuitive operation, according to the fourth embodiment.

Note that, within the scope of the present invention, the present invention may include a flexible combination of the embodiments, a modification of any component of the embodiments, or an omission of any component in the embodiments.

INDUSTRIAL APPLICABILITY

A button structure for touch panel according to the present invention is suitable for use in an electronic device or the like mounted on a vehicle since the button structure for touch panel is not subjected to restriction of arrangement by a touch panel.

REFERENCE SIGNS LIST

1, 1A, 1B, 1C: Button for touch panel, 2, 2A, 2B: First operating unit, 2a: First pusher, 2b: Second pusher, 2c: Contact point, 3: Second operating unit, 3a: Conductive contact portion, 4: Holder, 5: Elastic member, 5A, 5A-1, 5A-2: Rubber switch, 5a1: Protrusion, 5a2: Base portion, 5a3: Contact point, 5a4: Skirt portion, 5a5: Through-hole, 5B: Plate spring, 5b1: Protrusion, 5b2: Base portion, 5b3: Contact point, 6, 6A: Supporting portion, 6a: Thin portion, 7: Conductive part, 7a: Disk portion, 7b: Column portion, 7c: Contact point, 50: Touch panel

The invention claimed is:

1. A button structure for touch panel, the button structure comprising:
   a first operating unit made of a conductor and to be operated by being pushed down;
   a supporting portion made of an insulator and to be fixed on a capacitive touch panel, the supporting; portion supporting the first operating unit; and
   an elastic member accommodated inside the supporting portion, a surface of the elastic member being nonconductive, the surface being to be fixed to the touch panel,
   wherein when the first operating unit is pushed down, the elastic member is elastically deformed and a conductive path which extends from the first operating unit to the touch panel through a member brought into contact with the touch panel by the pushing down of the first operating unit is formed, the conductive path causing the pushing operation of the first operating unit to be detected by the touch panel.

2. The button structure for touch panel according to claim 1,
   wherein the first operating unit includes a first pusher formed into a protruding shape,
   the elastic member includes a conductive protrusion formed to be separated from the touch panel and be in contact with the first pusher, and
   when the first operating unit is pushed down, the first pusher presses the protrusion, thereby the elastic member is elastically deformed to generate click feeling, and the protrusion is brought into contact with the touch panel.

3. The button structure for touch panel according to claim 1, the button structure further comprising:
   a second operating unit made of a conductor and to be operated by being rotated,
   wherein the supporting portion supports the second operating unit in a rotatable manner.

4. The button structure for touch panel according to claim 1,
   wherein the first operating unit includes a first pusher formed into a protruding shape,
   the elastic member is a nonconductive rubber switch having a protrusion which is formed to be separated from the touch panel and include a through-hole,
   the button structure further includes a conductive part inserted into the through-hole and being in contact with the first pusher, and
   when the first operating unit is pushed down, the first pusher presses the protrusion via the conductive part, thereby the elastic member is elastically deformed to generate click feeling, and the conductive part is brought into contact with the touch panel.

5. The button structure for touch panel according to claim 1,
   wherein the first operating unit includes a first pusher and a second pusher each formed into a protruding shape,
   the elastic member is a nonconductive rubber switch having a protrusion which is formed to be separated from the touch panel and be in contact with the first pusher, and
   when the first operating unit is pushed down, the first pusher presses the protrusion, thereby the elastic member is elastically deformed to generate click feeling, and the second pusher is brought into contact with the touch panel.

6. The button structure for touch panel according to claim 1,
   wherein the first operating unit includes a first pusher and a second pusher each formed into a protruding shape and a conductive contact portion to be in contact with the touch panel and being elastically deformable,
   the elastic member is a nonconductive rubber switch having a protrusion which is formed to be separated from the touch panel,
   a gap is between the first pusher and the protrusion, the first operating unit is rotatable, and when the first operating unit is pushed down, the first pusher presses the protrusion, thereby the elastic member is elastically deformed to generate click feeling, and the second pusher is brought into contact with the touch panel.

7. An electronic device provided with the button structure for touch panel according to claim 1, the electronic device comprising:
   the touch panel.

8. A button for touch panel, the button comprising:
   a first operating unit made of a conductor and to be operated by being pushed down;
   a supporting portion made of an insulator and to be fixed on a capacitive touch panel, the supporting portion supporting the first operating unit; and
   an elastic member accommodated inside the supporting portion,
   wherein the supporting portion includes a thin portion for supporting the elastic member from a side of the touch panel,
   a surface of the elastic member is nonconductive, the surface being fixed to the thin portion, and
   when the first operating unit is pushed down, the elastic member is elastically deformed and a conductive path which extends from the first operating unit to the thin portion through a member brought into contact with the touch panel by the pushing down of the first operating unit is formed, the conductive path causing the pushing operation of the first operating unit to be detected by the touch panel.

* * * * *